United States Patent
Tuttle et al.

(10) Patent No.: US 6,359,561 B2
(45) Date of Patent: *Mar. 19, 2002

(54) METHOD OF MANUFACTURING AND TESTING AN ELECTRONIC DEVICE, AND AN ELECTRONIC DEVICE

(75) Inventors: Mark E. Tuttle, Boise; Rickie C. Lake, Eagle; Curtis M. Medlen, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/767,593

(22) Filed: Jan. 22, 2001

Related U.S. Application Data

(60) Continuation of application No. 09/393,224, filed on Sep. 9, 1999, now Pat. No. 6,211,785, which is a division of application No. 08/954,551, filed on Oct. 20, 1997, now Pat. No. 6,104,280.

(51) Int. Cl.$^7$ .............................................. G08B 13/14
(52) U.S. Cl. ................ 340/572.1; 340/572.4; 340/572.7; 340/572.8; 340/10.42; 174/254; 29/846
(58) Field of Search ............................ 340/572.1, 572.4, 340/572.7, 572.8, 10.42, 825.54; 361/749, 750, 751; 174/254; 29/846

(56) References Cited

U.S. PATENT DOCUMENTS

| | | | |
|---|---|---|---|
| 4,064,552 A | 12/1977 | Angelucci | 361/795 |
| 4,075,632 A | 2/1978 | Baldwin et al. | 343/6.8 |
| 4,157,007 A | 6/1979 | Venard | 368/83 |
| 4,659,872 A | 4/1987 | Dery et al. | 174/117 A |
| 4,675,989 A | 6/1987 | Galloway et al. | 29/622 |
| 4,926,182 A | 5/1990 | Ohta et al. | 342/44 |
| 5,099,090 A | 3/1992 | Allan et al. | 29/842 |
| 5,156,772 A | 10/1992 | Allan et al. | 252/514 |
| 5,220,488 A | 6/1993 | Denes | 361/398 |
| 5,223,741 A | 6/1993 | Bechtel et al. | 257/678 |
| 5,468,681 A | 11/1995 | Pasch | 437/183 |
| 5,479,694 A | 1/1996 | Baldwin | 29/593 |
| 5,621,412 A | 4/1997 | Sharpe et al. | 342/51 |
| 5,649,296 A | 7/1997 | MacLellan et al. | 455/38.2 |
| 5,727,310 A | 3/1998 | Casson et al. | 29/830 |
| 5,741,148 A | 4/1998 | Biernath | 439/284 |
| 5,821,624 A | 10/1998 | Pasch | 257/776 |
| 5,861,662 A | 1/1999 | Candelore | 257/679 |
| 5,917,229 A | 6/1999 | Nathan et al. | 257/529 |
| 6,025,087 A | 2/2000 | Trosper | 429/92 |
| 6,104,280 A | 8/2000 | Tuttle et al. | 340/10.42 |
| 6,211,785 B1 * | 4/2001 | Tuttle et al. | 340/572.1 |

* cited by examiner

*Primary Examiner*—Daniel J. Wu
*Assistant Examiner*—Toan Pham
(74) *Attorney, Agent, or Firm*—Wells St. John P.S.

(57) ABSTRACT

A method of manufacturing and testing an electronic circuit, the method comprising forming a plurality of conductive traces on a substrate and providing a gap in one of the conductive traces; attaching a circuit component to the substrate and coupling the circuit component to at least one of the conductive traces; supporting a battery on the substrate, and coupling the battery to at least one of the conductive traces, wherein a completed circuit would be defined, including the traces, circuit component, and battery, but for the gap; verifying electrical connections by performing an in circuit test, after the circuit component is attached and the battery is supported; and employing a jumper to electrically close the gap, and complete the circuit, after verifying electrical connections. An electronic circuit comprising a substrate; a plurality of conductive traces on the substrate, with a gap in one of the conductive traces; a circuit component attached to the substrate and coupled to at least one of the conductive traces; a battery supported on the substrate and coupled to at least one of the conductive traces, wherein a completed circuit would be defined, including the traces, circuit component, and battery, but for the gap; and a jumper electrically closing the gap and completing the circuit, the jumper comprising conductive epoxy.

17 Claims, 9 Drawing Sheets

METHOD OF MANUFACTURING AND TESTING AN ELECTRONIC DEVICE, AND AN ELECTRONIC DEVICE

CROSS REFERENCE TO RELATED APPLICATION

This is a Continuation of U.S. patent application Ser. No. 09/393,224, filed Sep. 9, 1999, and titled "Method of Manufacturing and Testing an Electronic Device and an Electronic Device", now U.S. Pat. No. 6,211,785, which in turn is a division of U.S. patent application Ser. No. 08/954,551, filed Oct. 20, 1997, now U.S. Pat. No. 6,104,280.

TECHNICAL FIELD

This invention relates to techniques for manufacturing circuitry. The invention also relates to methods of testing circuitry.

BACKGROUND OF THE INVENTION

When manufacturing circuitry, after attaching components to a substrate, such as to a circuit board or flexible material, it is desirable to perform testing. These tests, among other things, are to make sure that circuit connections have been properly made, are sufficiently conductive, and are not cold connections. Such testing is known in the art as "in-circuit" testing. It is difficult to perform such testing while power is supplied to the circuitry, such as by an on board cell or battery.

In circuit testing is performed for a wide variety of types of circuitry. Just one example of circuitry for which in circuit testing is performed is in identification circuitry.

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. One way of tracking objects is with an electronic identification system.

Some such systems generally include an identification device including circuitry provided with a unique identification code in order to distinguish between a number of different devices. Typically, the identification devices are entirely passive (have no power supply). However, this identification system is only capable of operation over a relatively short range, limited by the size of a magnetic field used to supply power to the devices and to communicate with the devices.

Another type of electronic identification system, and various applications for such systems are described in detail in commonly assigned U.S. patent application Ser. No. 08/705,043, filed Aug. 29, 1996, and incorporated herein by reference. The system includes an active transponder device affixed to an object to be monitored which receives a signal from an interrogator. The device receives the signal, then generates and transmits a responsive signal. Because active devices have their own power sources, they do not need to be in close proximity to an interrogator or reader to receive power via magnetic coupling. Therefore, active transponder devices tend to be more suitable for applications requiring tracking of a tagged device that may not be in close proximity to an interrogator. For example, active transponder devices tend to be more suitable for inventory control or tracking.

Electronic identification systems can also be used for remote payment. For example, when a radio frequency identification device passes an interrogator at a toll booth, the toll booth can determine the identity of the radio frequency identification device, and thus of the owner of the device, and debit an account held by the owner for payment of toll or can receive a credit card number against which the toll can be charged. Similarly, remote payment is possible for a variety of other goods or services.

Testing of battery powered circuitry of this or other types typically requires delaying connection of the battery to the circuit until in circuit testing is completed. Then, another in circuit test must be performed to verify the battery connections.

SUMMARY OF THE INVENTION

The invention provides a method of manufacturing and testing an electronic circuit. A plurality of conductive traces are formed on a substrate and a gap is provided in one of the conductive traces. A circuit component is attached to the substrate and coupled to at least one of the conductive traces. A battery is supported on the substrate and coupled to the battery to at least one of the conductive traces, wherein a completed circuit would be defined, including the traces, circuit component, and battery, but for the gap. Electrical connections are verified by performing an in circuit test, after the circuit component is attached and the battery is supported. A jumper is employed to electrically close the gap, and complete the circuit, after the electrical connections are verified.

In one aspect of the invention, employing the jumper comprises employing conductive epoxy.

In another aspect of the invention, employing a jumper comprises placing a conductor across the gap and coupling the conductor to traces on either side of the gap with conductive epoxy.

In another aspect of the invention, employing a jumper comprises placing a resistor across the gap and coupling the resistor to traces on either side of the gap with conductive epoxy.

In one aspect of the invention, a jumper is formed by wire bonding; e.g., by ultrasonically bonding a wire loop to traces on either side of the gap.

In one aspect of the invention, the battery is mechanically supported from the substrate by epoxy. In another aspect of the invention, the battery is electrically coupled to at least one of the traces by conductive epoxy.

Another aspect of the invention provides an electronic circuit comprising a substrate, and a plurality of conductive traces on the substrate, with a gap in one of the conductive traces. A circuit component is attached to the substrate and coupled to at least one of the conductive traces. A battery is supported on the substrate and coupled to at least one of the conductive traces, wherein a completed circuit would be defined, including the traces, circuit component, and battery, but for the gap. A jumper electrically closes the gap and completes the circuit. The jumper comprises conductive epoxy.

In one aspect of the invention, the jumper comprises conductive epoxy having a resistance of less than 1000 ohms prior to curing.

In another aspect of the invention, the jumper comprises a conductor across the gap and the conductive epoxy couples the conductor to the conductive traces on either side of the gap.

In another aspect of the invention, the jumper comprises a resistor across the gap and the conductive epoxy couples the resistor to the conductive traces on either side of the gap.

In another aspect of the invention, the size of the gap is approximately 30 thousandths of an inch.

In another aspect of the invention, the circuit component comprises an integrated circuit. In one aspect of the invention, the circuit component comprises an integrated circuit defining a wireless identification device including a receiver, a transponder, a microprocessor, and a memory.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
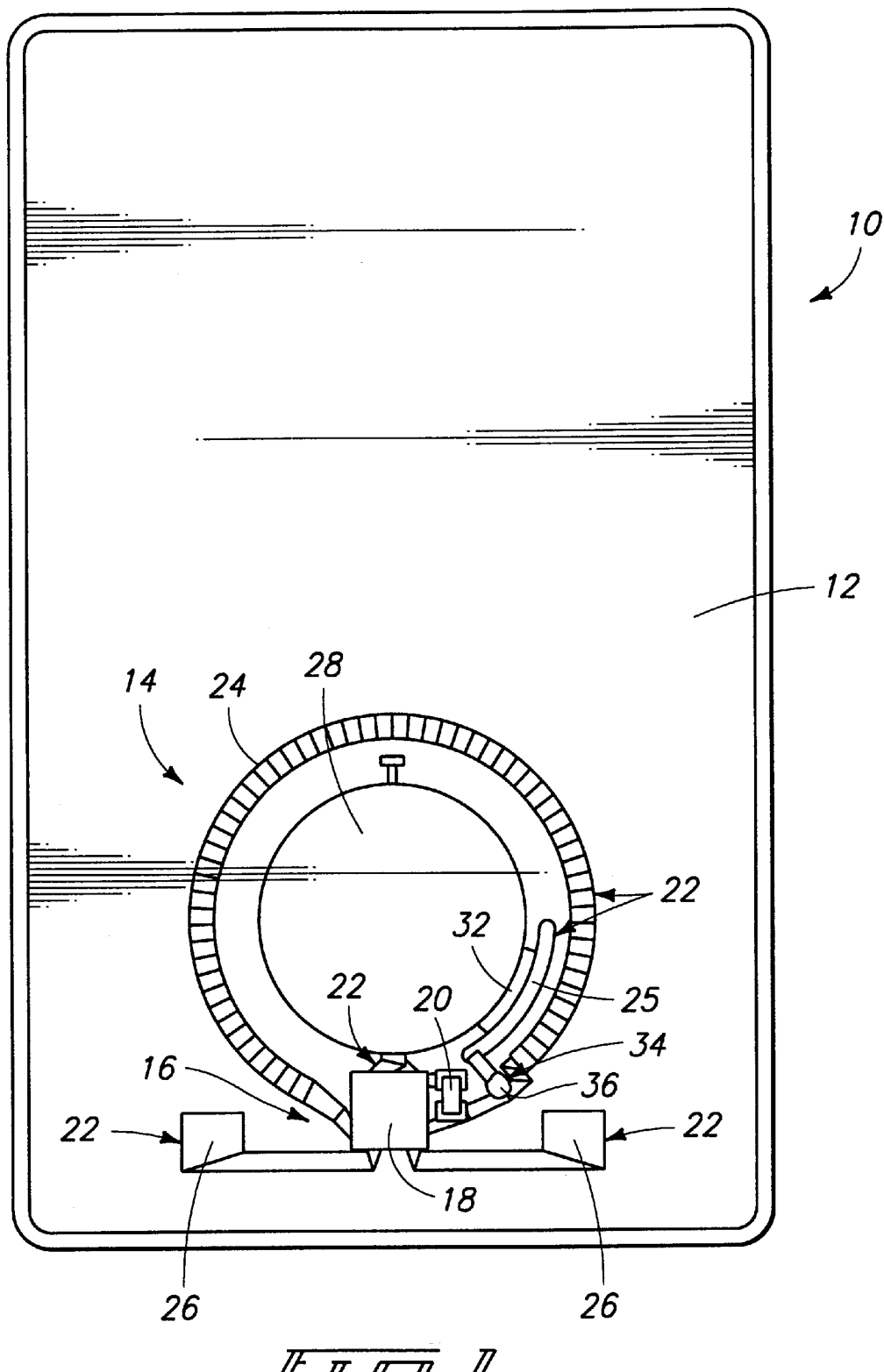
FIG. 1 is a plan view showing construction details of an electronic device embodying the invention prior to completing or closing a housing thereof.

FIG. 1 illustrates an electronic device 10 in accordance with one embodiment of the invention. In the illustrated embodiment, the device 10 includes a substrate 12. The substrate 12 can be a printed circuit board or a substrate appropriate for a flex circuit.

The device 10 further includes circuitry 14 including circuit components 16 on the substrate. The invention has application to circuitry including any of various types of circuit components. For example, the circuit components 16 can include one or more integrated circuits. In the embodiment shown in FIG. 1, the circuit components 16 include an integrated circuit 18 as described in U.S. patent application Ser. No. 08/705,043, filed Aug. 29, 1996 and incorporated herein by reference. In the illustrated embodiment, the integrated circuit 18 comprises a receiver, a transmitter or backscatter modulator, a microprocessor, and a memory, and is useful for inventory monitoring or RFID (radio frequency identification device) or RIC (remote intelligent communications) applications. In the illustrated embodiment, the circuit components 16 further include a capacitor 20. Other types of circuit components, such as different types of integrated circuits, resistors, capacitors, inductors, etc. are employed in alternative embodiments.

The circuitry 14 further includes conductors or circuit traces 22 on the substrate 12 connecting together the circuit components 16. The circuit traces 22 are typically copper if the substrate 12 is a printed circuit board, and are typically copper or Printed Thick Film (PTF) in a flex circuit. Printed Thick Film comprises a polymer filled with flecks of metal such as silver or copper. The circuitry 14 includes a first or negative battery connection or terminal 23 (see FIG. 3). In the illustrated embodiment, the negative battery connection 23 is defined by a plurality of radially spaced apart contact points which provide an enhanced connection. In alternative embodiments a single, contiguous, or central contact point is provided. Other forms of battery connections, such as metal clip connections can be employed. The circuitry 14 further includes a second or positive battery connection or terminal 25 defined by the conductive traces.

In an embodiment there the circuit components are used for communications, the circuit traces 22 connect at least one antenna to the integrated circuit 18 for electromagnetic transmission and reception. More particularly, in the illustrated embodiment, the integrated circuit 18 receives and sends microwave frequencies, and one of the circuit traces 22 defines a loop antenna 24 appropriately sized to receive microwave transmissions of a selected frequency, and other traces 22 define a dipole antenna 26 appropriately sized for responding at a selected microwave frequency, such as by backscatter reflection.

The device 10 further includes a power source 28. In the illustrated embodiment, the power source 28 is a battery. In one embodiment, the battery is a thin profile or button-type cell forming a small, thin energy cell more commonly utilized in watches and small electronic devices requiring a thin profile. Such battery cells have a pair of terminals or electrodes: a lid or negative terminal, and a can or positive terminal. In an alternative embodiment, multiple batteries are provided (e.g., coupled together in series or parallel).

The device 10 can be included in any appropriate housing or packaging. Various methods of manufacturing housings are described in commonly assigned U.S. patent application Ser. No. 08/800,037, filed Feb. 13, 1997, incorporated herein by reference. In the illustrated embodiment, the device 10 includes a housing defined in part by the substrate.

A method of manufacturing the device 10 will now be described, reference being made to FIGS. 2–9.

Figure 2:
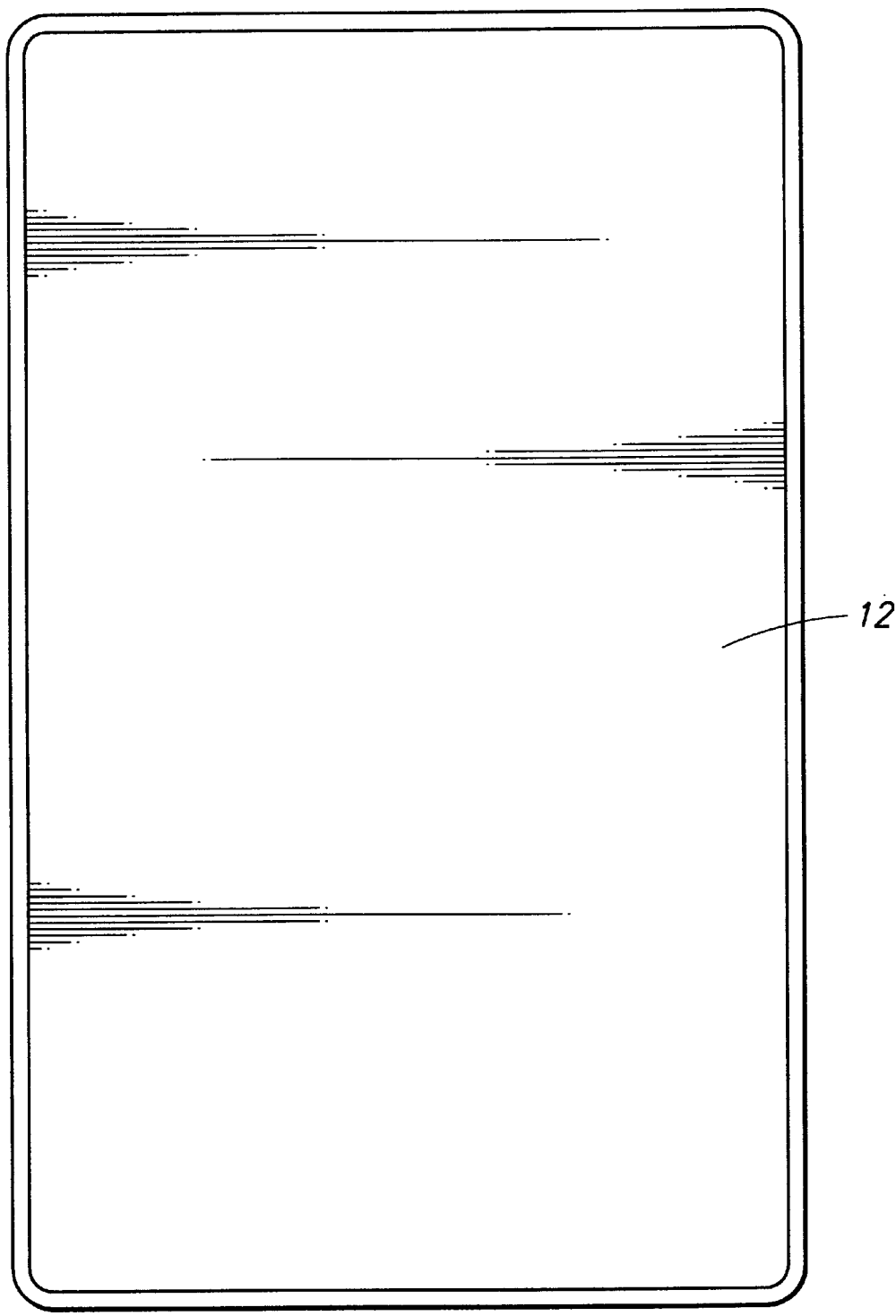
FIG. 2 is a plan view of a substrate employed in a method of manufacturing the device of FIG. 1.

As shown in FIG. 2, the substrate 12 is provided. The term "substrate" as used herein refers to any supporting or supportive structure, including, but not limited to, a supportive single layer of material or multiple layer constructions. In the illustrated flex circuit embodiment, the substrate 12 comprises a polyester film. Other materials are possible. As discussed above, the substrate can be a printed circuit board.

Figure 3:
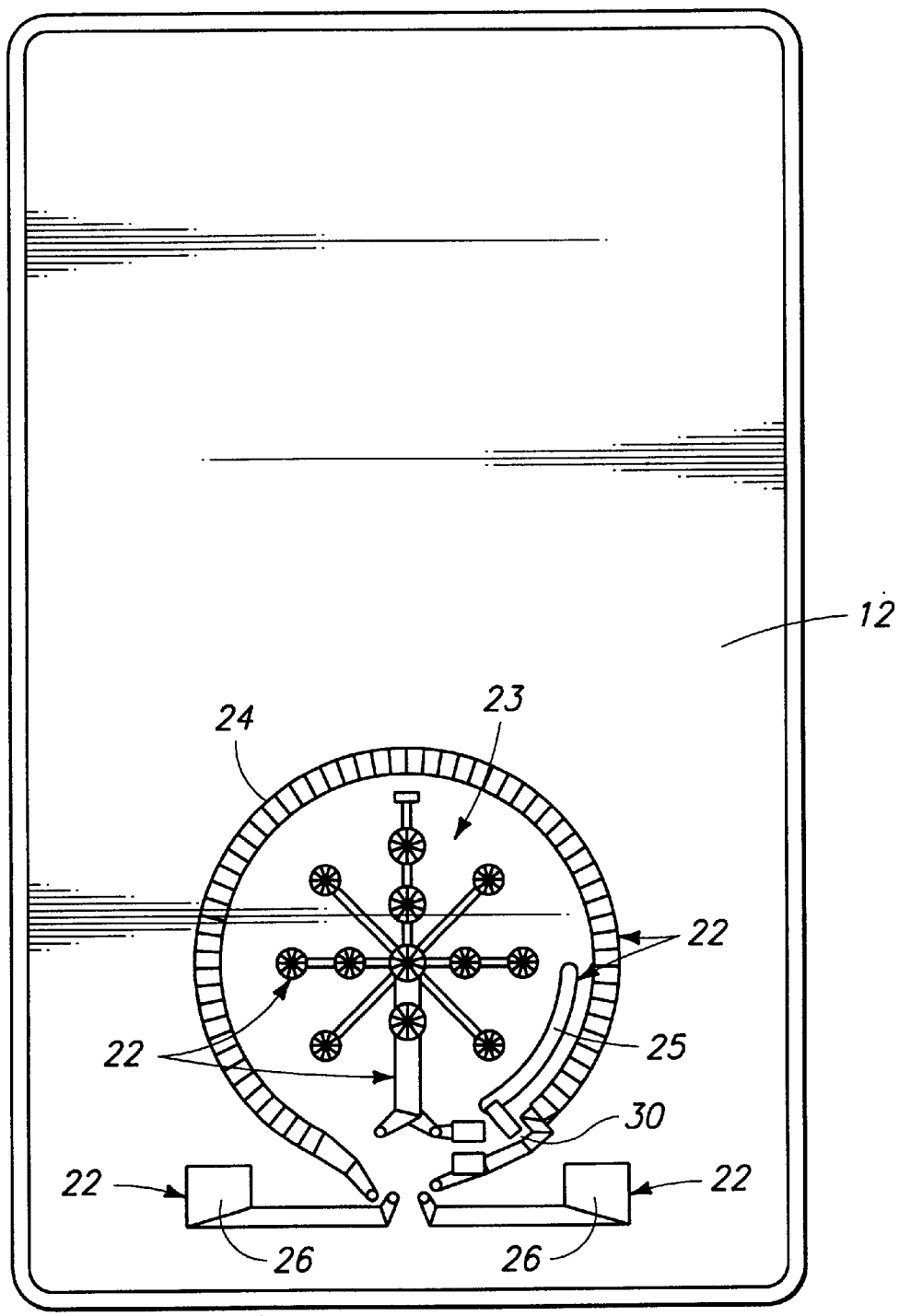
FIG. 3 is a plan view of the substrate of FIG. 2 after further processing in accordance with the method of manufacturing the device of FIG. 1.

The circuit traces 22 are then defined, as shown in FIG. 3. The circuit traces 22 are typically copper if the substrate 12 is a printed circuit board, and are typically copper or Printed Thick Film (PTF) in a flex circuit. In one embodiment, PTF is formed or applied over the substrate 12 to define the circuit traces 22. The circuit traces 22 interconnect the circuit components 16. The circuit traces 22 define, among other things, the first or negative battery connection 23 and the second or positive battery connection 25.

One manner of forming or applying the conductive ink on the substrate is to screen print the ink on the substrate through conventional screen printing techniques.

A gap 30 is provided along a trace 22 or spaced apart portions are defined in the traces which cause an open circuit unless they are electrically coupled together. After the battery and integrated circuit are coupled to the traces 22, a complete circuit would be formed, including the circuit traces, the integrated circuit 16 (see FIG. 1), and the battery, but for the gap. The size of the gap is approximately 30 mils (thousandths of an inch). In one embodiment, the size of the gap is 30 mils or less. In another embodiment, the size of the gap is between 10 and 50 mils. In a more particular embodiment, the size of the gap is between 20 and 40 mils. In another embodiment, the size of the gap is sufficiently small that it can be bridged by a drop of conductive epoxy.

Figure 4:
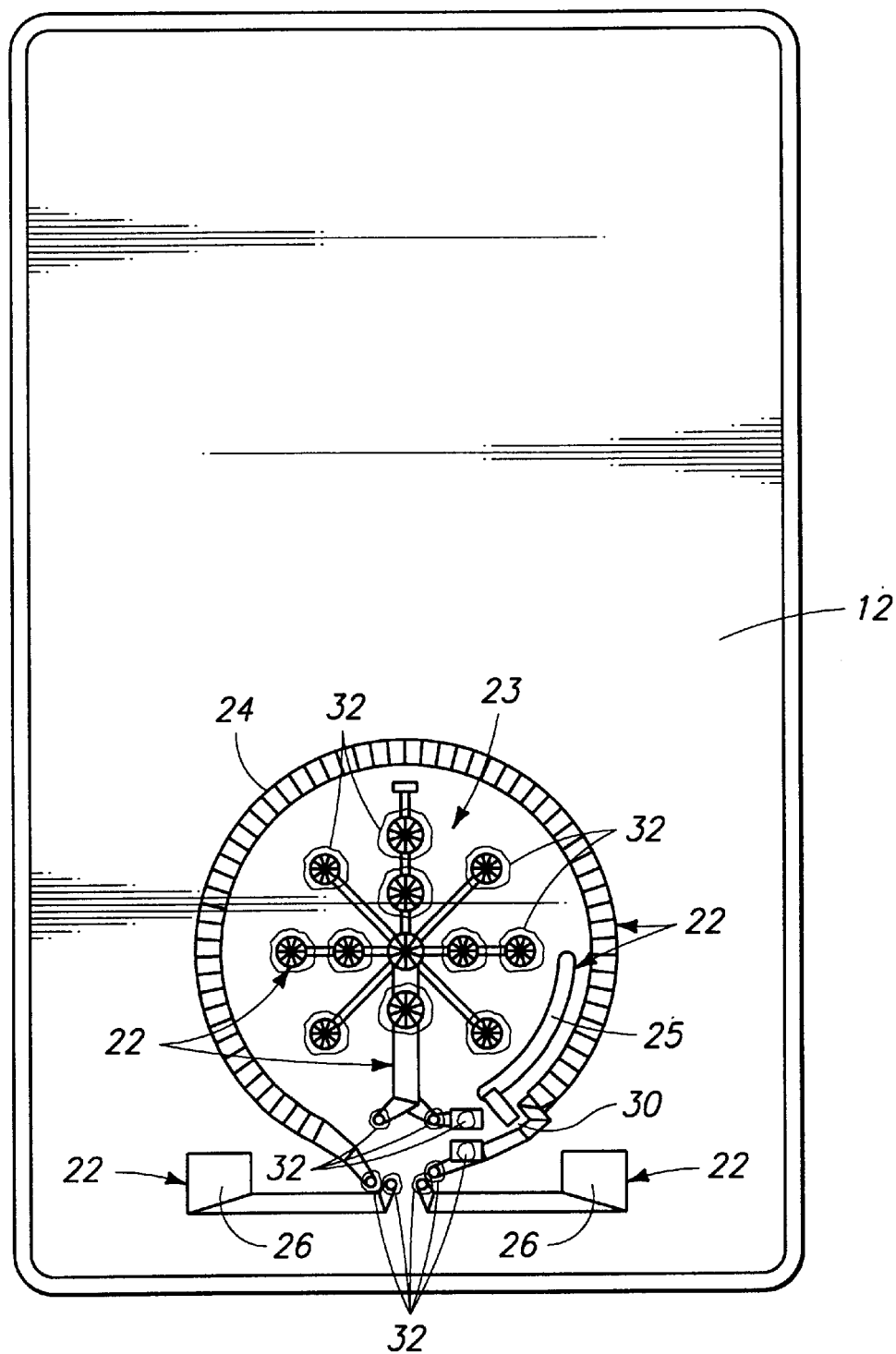
FIG. 4 is a plan view showing further processing in accordance with the method of manufacturing the device of FIG. 1.
Figure 5:
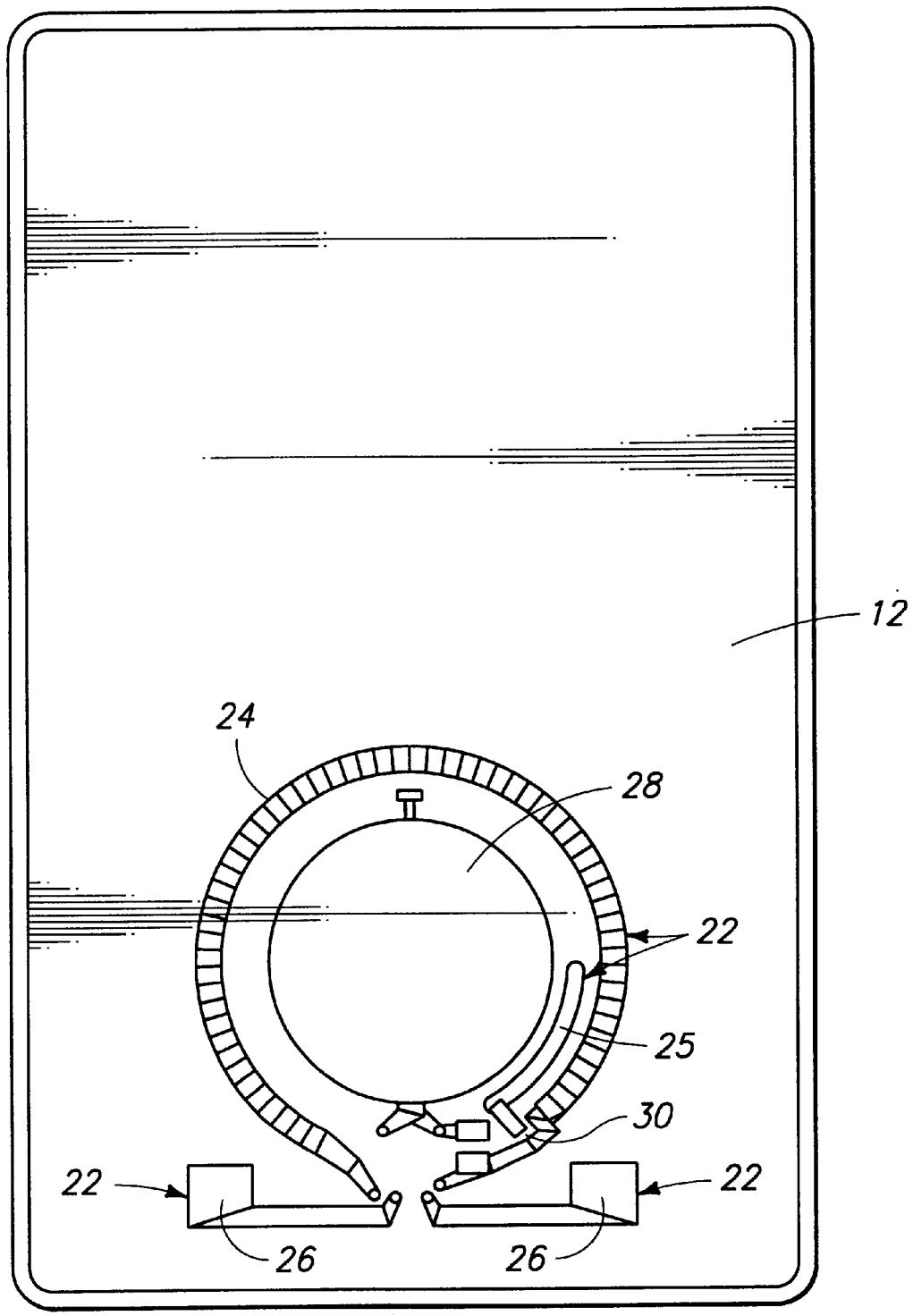
FIG. 5 is a plan view showing further processing in accordance with the method of manufacturing the device of FIG. 1.

Conductive epoxy 32 is applied over desired areas (e.g., under the battery, under the integrated circuit, etc.) using a stencil printer to assist in material application, as shown in FIG. 4. The conductive epoxy is used to assist in component attachment. The battery 28 is provided and mounted on the substrate 12 using the conductive epoxy on the connection 23 to secure the battery 28 to the substrate 12, as shown in FIG. 5.

In the illustrated embodiment, the battery 28 is placed lid down such that the conductive epoxy makes electrical contact between the negative terminal of the battery and at least a portion of the first battery connection 23 that extends underneath the lid of the battery in the view shown in FIG. 1.

Conductive epoxy is dispensed relative to the battery perimetral edge using a syringe dispenser, after the battery 28 is mounted. The conductive epoxy electrically connects the perimetral edge of the battery 28 with an adjacent arcuate portion of the second battery connection 25. In the illustrated embodiment, the perimetral edge defines the can of the battery, such that the conductive epoxy connects the positive terminal of the battery to the battery connection terminal 25.

Figure 6:
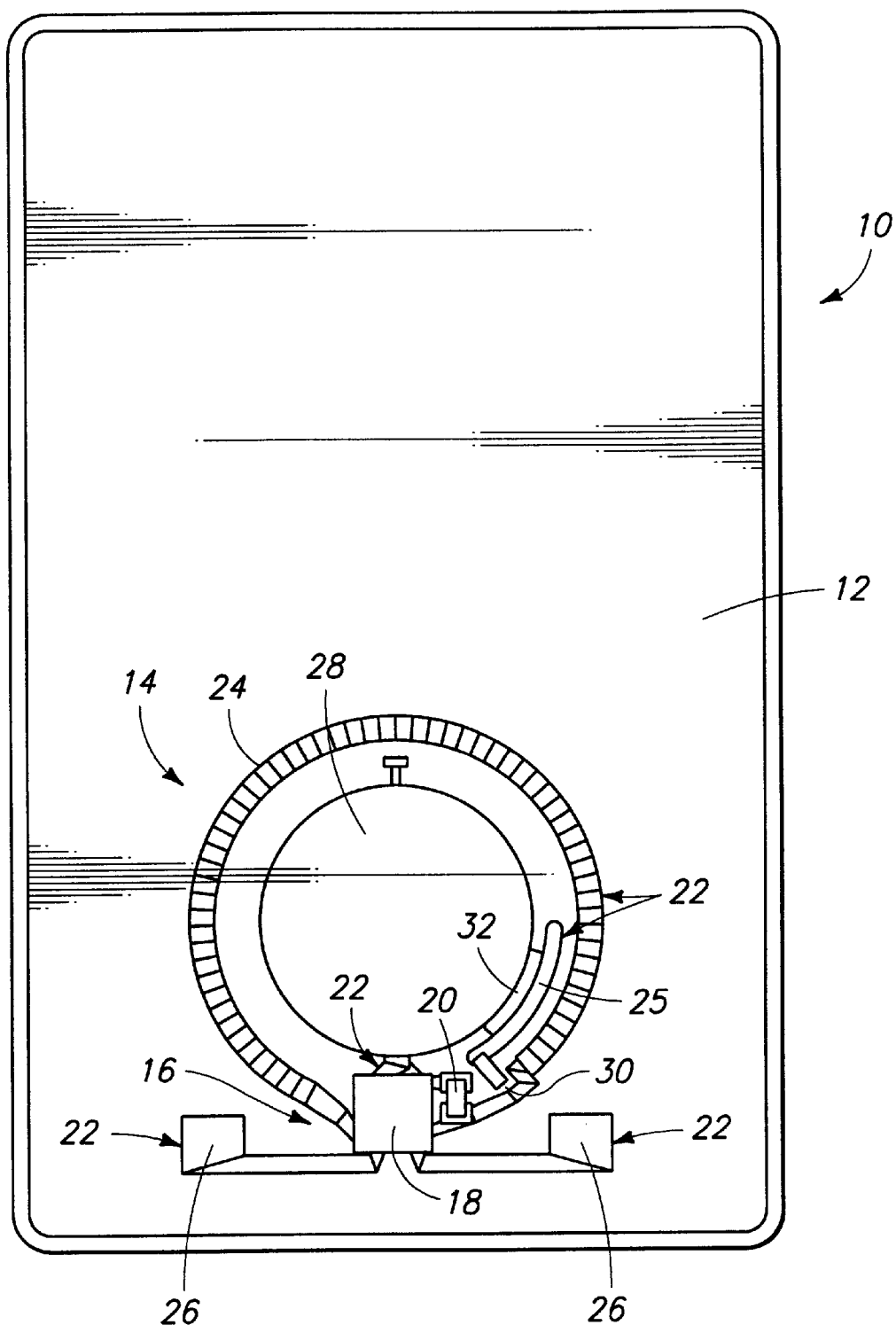
FIG. 6 is a plan view showing further processing in accordance with the method of manufacturing the device of FIG. 1.

The integrated circuit 18 is provided and mounted on the substrate 12 using the conductive epoxy (e.g., picked and placed using surface mounting techniques), to produce the device shown in FIG. 6. An exemplary and preferred integrated circuitry is described in U.S. patent application Ser. No. 08/705,043 incorporated by reference above. The integrated circuit 18 has pins, and the pins are coupled to appropriate conductive traces (e.g., using conductive epoxy) for connection of the integrated circuit 18 to the battery 28. If the integrated circuit 18 is used for communications, as is the case for the illustrated embodiment, pins of the integrated circuit 18 are coupled to conductive traces 22 defining one or more antennas 24 and 26. In the illustrated embodiment, the integrated circuit 18 defines a wireless identification device including a receiver, a modulator, a microprocessor and a memory. The receiver receives microwave frequencies and the modulator is a backscatter modulator. The capacitor 20 is similarly provided and mounted.

The integrated circuit 18, capacitor 20 and battery 28 can be provided and mounted to the substrate 12 in any order, or can occur simultaneously.

In circuit testing is then performed to verify the electrical connections.

After the in-circuit testing is performed to verify the electrical connections, a jumper 34 is employed to electrically close or repair the gap 30 (see FIG. 3) and complete the circuit defined by the circuitry 14, shown in FIG. 1. In one embodiment, shown in FIG. 1 employing a jumper 34 comprises employing conductive epoxy 36. More particularly, employing a jumper 34 comprises dispensing conductive epoxy 36 over the gap 30. In one embodiment, employing a jumper 34 comprises dispensing conductive epoxy having a resistance of less than 1000 ohms within, for example, 500 milliseconds (or less) of being dispensed. In a more particular embodiment, the conductive epoxy has a resistance of less than 1000 ohms within 200 milliseconds of being dispensed. One exemplary conductive epoxy that could by used is Quick Connect Silver, EXPFDA-4118-D/4107 produced by International Micro Electronics Research Corporation, 8010 Dearborne Rd., Nampa, Id. 83686. This is in contrast to the conductive epoxy used to connect the battery 28 to the circuit traces 22. The conductive epoxy 32 used to connect the battery to the circuit traces 22 is typically isotropic conductive epoxy that has a low and unstable conductivity until partially cured. This epoxy 22 performs dual functions of forming electrical connections and mechanically supporting the battery 28 from the substrate 12. If the gap 30 is not employed, this slow curing may not allow the circuitry 14 to power up properly. For example, the integrated circuit 18 may lock up.

Previously, the battery 28 was not connected until the in circuit testing was completed. Then, the battery 28 was connected and another in circuit test would have to be performed to test the battery connections. Also, a reboot of the circuitry 14 had to be performed because conductive epoxy used to connect the battery 28 to the integrated circuit 18 does not have an uncured conductivity that is sufficiently high. Provision of the gap 30 and a sufficiently conductive material solves all these problems.

Figure 7:
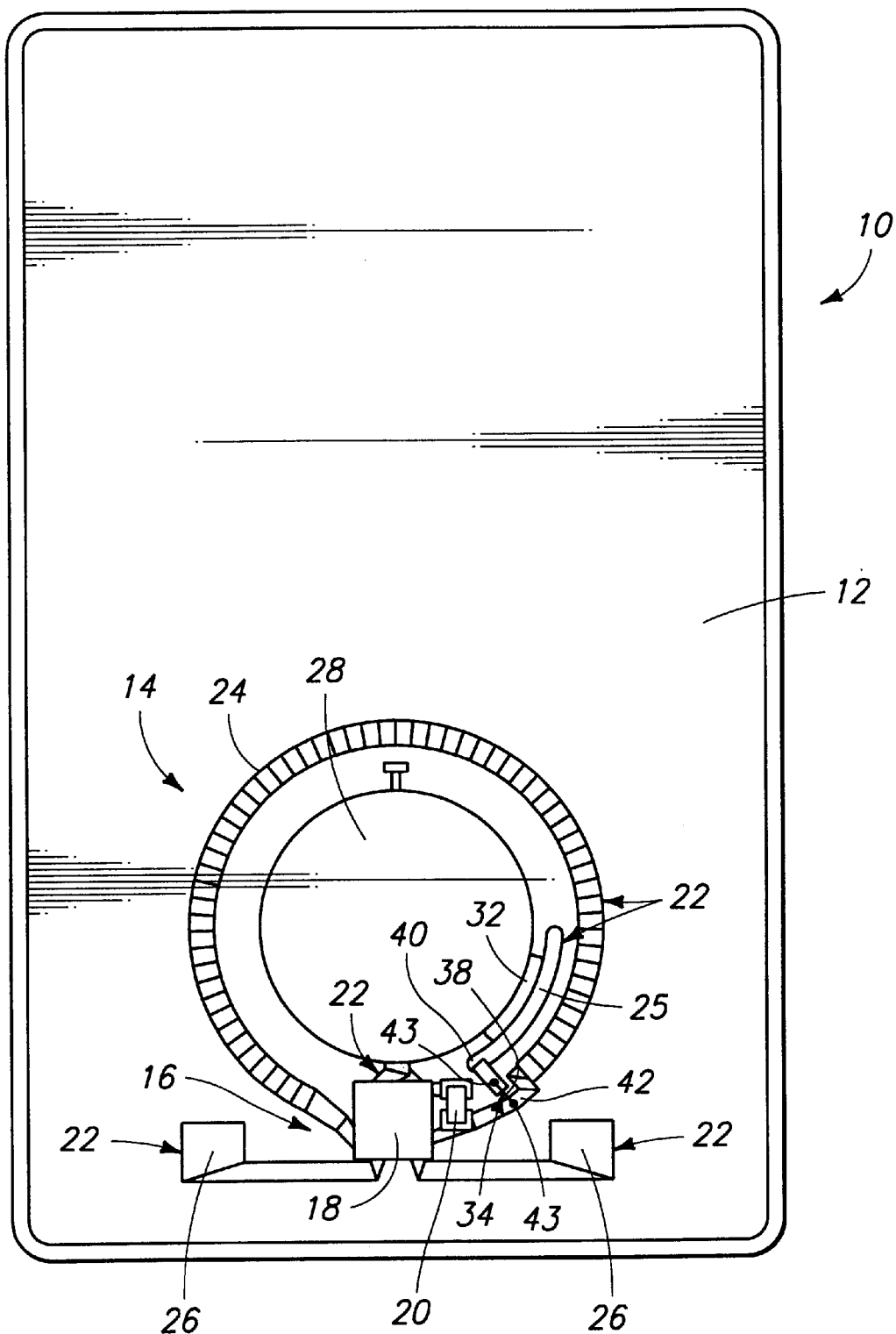
FIG. 7 is a plan view illustrating an alternative embodiment of the invention at a processing stage similar to the stage illustrated in FIG. 6.
Figure 8:
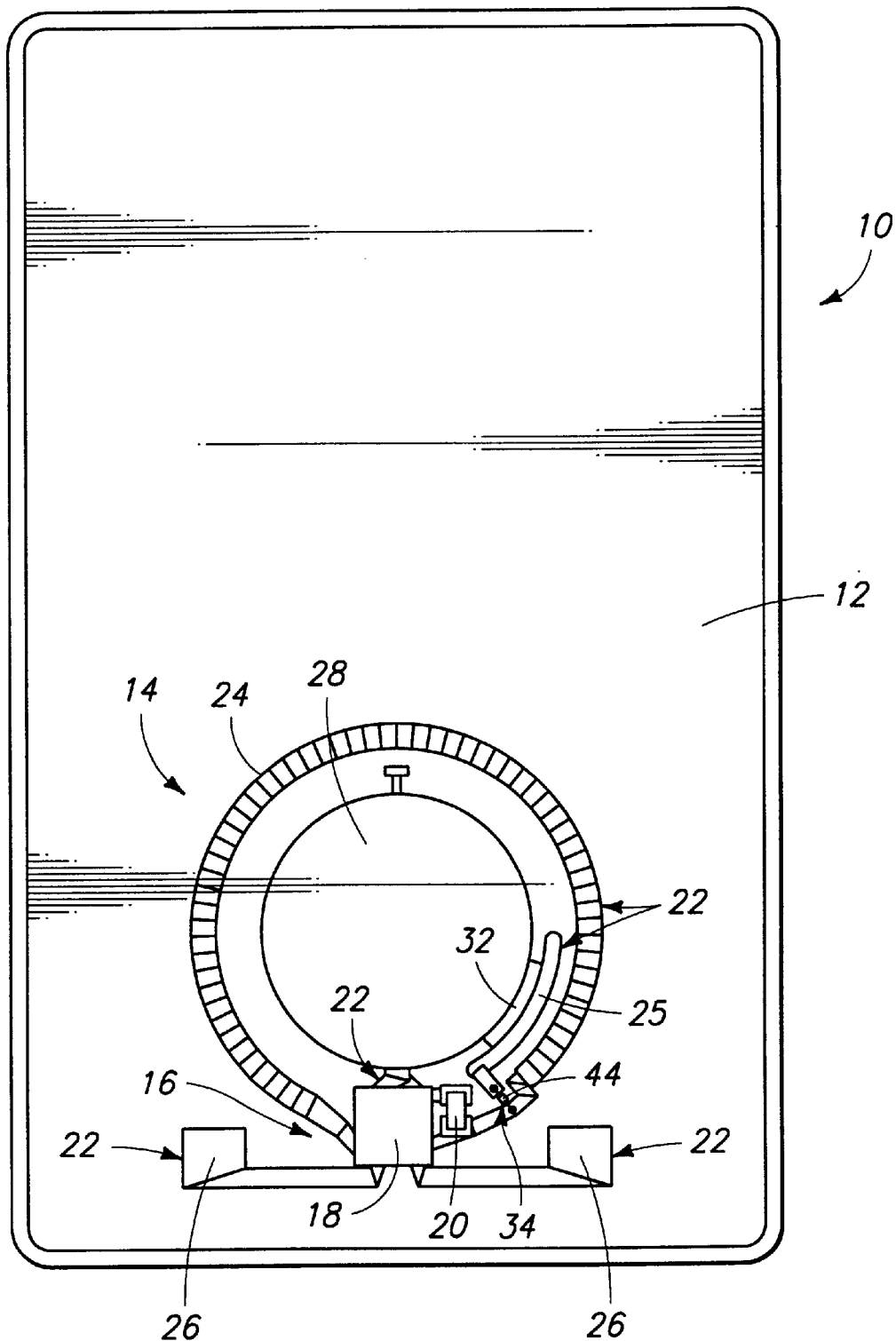
FIG. 8 is a plan view illustrating another alternative embodiment of the invention at a processing stage similar to the stage illustrated in FIG. 6.
Figure 9:
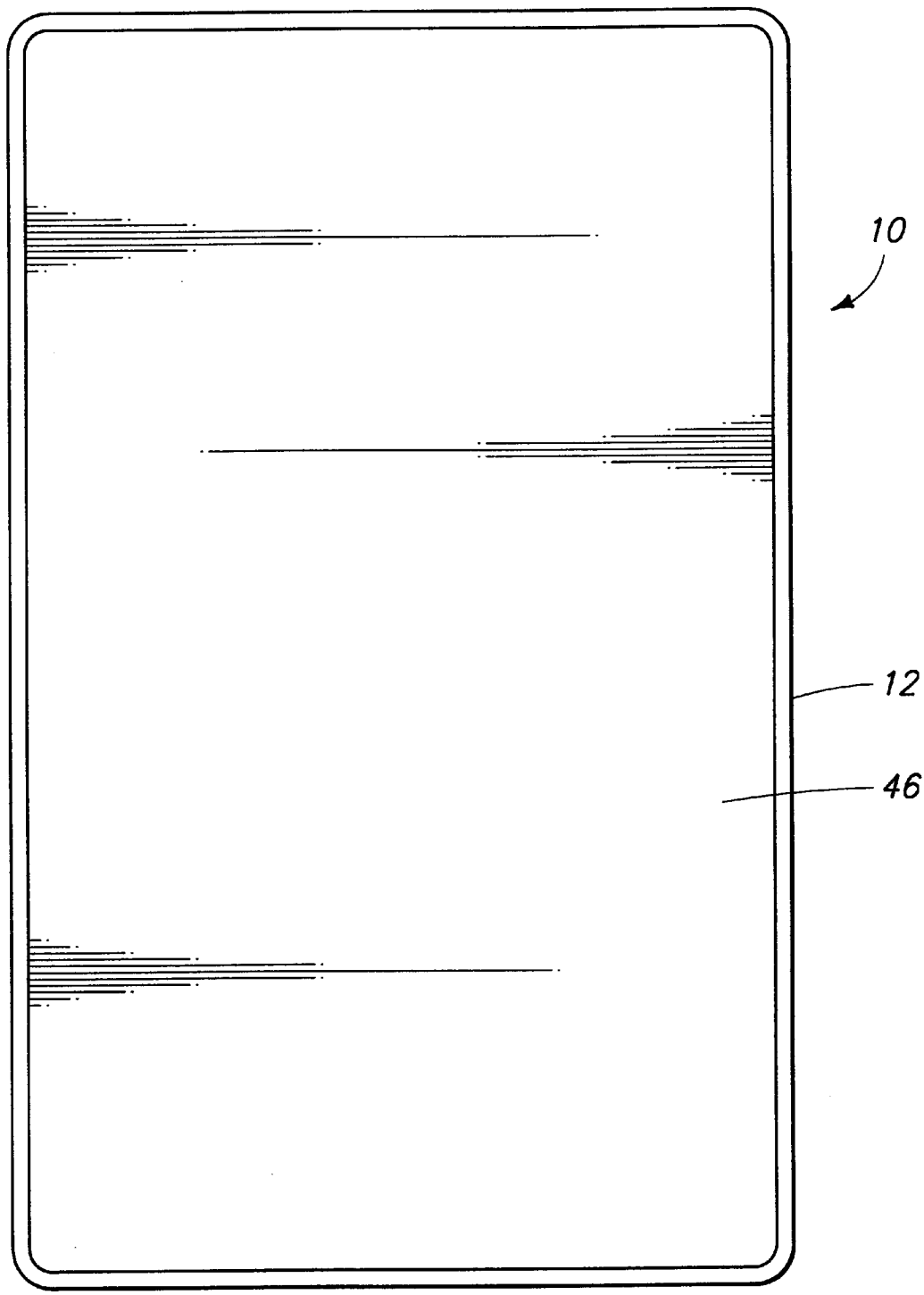
FIG. 9 is a plan view illustrating processing after the stage shown in FIGS. 6, 7, or 8.

In another embodiment, shown in FIG. 7, employing a jumper 34 comprises placing a conductor 38 across the gap 30 and coupling the conductor 38 to traces 40 and 42 on either side of the gap 30 with conductive epoxy 43 (e.g., conductive epoxy having a resistance of less than 1000 ohms within 500 milliseconds of being dispensed) or by wire bonding (ultrasonic bonding). In another embodiment, shown in FIG. 8, employing a jumper 34 comprises placing a resistor 44 across the gap 30 and coupling the resistor to traces on either side of the gap 30 with conductive liquid such as conductive epoxy (e.g., conductive epoxy having a resistance of less than 1000 ohms within 500 milliseconds of being dispensed). In such embodiments, the gap 30 would typically be larger than 30 mils and may be, for example, a distance less than or approximating the length of a resistor.

If a conductive epoxy is employed for the conductive liquid, the conductive epoxy is then cured.

Subsequently (see FIG. 9), encapsulating epoxy material 46 is flowed or provided to encapsulate the substrate 12, to cover the integrated circuit 18, battery 28, and conductive traces 22 and to define a second housing portion.

Thus, the invention allows in circuit testing to be performed after a battery has been electrically and mechanically coupled using conductive epoxy. Two step in circuit testing, before and after inserting a battery, is avoided. In circuit testing can be performed after the battery is supported from the housing by conductive epoxy. Lock up of circuitry is avoided because connecting the battery to the circuitry now involves using only a small amount of conductive epoxy, that does not need to mechanically support the battery from the housing. Conductive epoxy used to mechanically support the battery from the housing and to electrically connect the battery to circuit traces is allowed to cure before the gap is closed with conductive epoxy. The connection made between the battery and the circuit traces, with conductive epoxy, can also be tested during the in circuit test.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An electronic circuit comprising:
   a substrate;
   a plurality of conductive traces on the substrate, with a gap in one of the conductive traces;
   a circuit component supported by the substrate and coupled to at least one of the conductive traces;
   a power source supported by the substrate and coupled to at least one of the conductive traces, wherein a completed circuit would be defined, including the traces, circuit component, and power source, but for the gap; and
   a jumper electrically closing the gap, and completing the circuit when the circuit is in operation, the jumper comprising conductive epoxy.

2. An electronic circuit in accordance with claim 1 wherein the jumper comprises conductive epoxy having a resistance of less than 1000 ohms prior to curing.

3. An electronic circuit in accordance with claim 1 wherein the jumper comprises a conductor across the gap and wherein the conductive epoxy couples the conductor to the conductive traces on either side of the gap.

4. An electronic circuit in accordance with claim 1 wherein the jumper comprises a resistor across the gap and wherein the conductive epoxy couples the resistor to the conductive traces on either side of the gap.

5. An electronic circuit in accordance with claim 1 wherein the size of the gap is approximately 30 thousandths of an inch.

6. An electronic circuit comprising:
   a substrate;
   first and second conductive traces on the substrate, the first trace having a first portion and the second trace having a second portion spaced apart from the first portion;
   an integrated circuit, including a processor, supported by the substrate and coupled to at least one of the conductive traces;
   a power source coupled to at least one of the conductive traces, wherein a completed circuit would be defined, including the traces, circuit component, and power source, if the first portion was coupled to the second portion; and
   a jumper electrically closing the gap, the jumper comprising conductive epoxy.

7. An electronic circuit in accordance with claim 6 wherein the battery is mechanically supported from the substrate by epoxy.

8. An electronic circuit in accordance with claim 6 wherein the battery is electrically coupled to one of the conductive traces by conductive epoxy.

9. An electronic circuit in accordance with claim 6 wherein the distance between the first and second portions is equal to or less than 30 mils.

10. An electronic circuit in accordance with claim 6 wherein the circuit component comprises an integrated circuit.

11. An electronic circuit comprising:
    a substrate;
    first and second conductive traces on the substrate, the first trace having a first portion and the second portion spaced apart from the first portion;
    a circuit component attached to an integrated circuit, including a microprocessor, supported by the substrate and coupled to at least one of the conductive traces;
    a power source coupled to at least one of the conductive traces, wherein a completed circuit would be defined, including the traces circuit component, and power source, if the first portion was coupled to the second portion;
    conductive epoxy at least in part supporting the battery from the substrate; and
    a jumper electrically closing the gap, and completing the circuit when the circuit is in operation, the jumper comprising conductive epoxy.

12. An electronic circuit in accordance with claim 11 wherein the first portion is spaced apart from the second portion by a distance that is sufficiently small so as to be capable of being bridged by a drop of conductive epoxy.

13. An electronic circuit in accordance with claim 11 wherein the first portion is spaced apart from the second portion by 30 mils or less.

14. An electronic circuit in accordance with claim 11 wherein the first portion is spaced apart from the second portion by a distance that is sufficiently small so as to be capable of being bridged by a drop of conductive epoxy having a resistance of less than 1000 ohms within 500 milliseconds of being dispensed.

15. An electronic circuit in accordance with claim 11 wherein the conductive epoxy is on the first and second portions and wherein the jumper further comprises a metal conductor between the conductive epoxy on the first and second portions.

16. An electronic circuit in accordance with claim 11 wherein the conductive epoxy is on the first and second portions and wherein the jumper further comprises a resistor between the conductive epoxy on the first and second portions.

17. An electronic circuit in accordance with claim 11 wherein the battery is electrically coupled to at least one of the traces by the conductive epoxy.

* * * * *